United States Patent
Wang

(12) 
(10) Patent No.: US 6,836,234 B1
(45) Date of Patent: Dec. 28, 2004

(54) SYSTEM FOR MATCHING RISE AND FALL TIMES OF DRIVE SIGNALS IN A DIGITAL TO ANALOG CONVERTER

(75) Inventor: Hongwei Wang, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/665,618

(22) Filed: Sep. 22, 2003

(51) Int. Cl.⁷ .............................................. H03M 1/66
(52) U.S. Cl. ..................... 341/145; 341/136; 341/144
(58) Field of Search ................................ 341/145, 136, 341/144, 118, 120

(56) References Cited

U.S. PATENT DOCUMENTS 6,100,830 A * 8/2000 Dedic .......................... 341/136
6,340,939 B1 * 1/2002 Dedic .......................... 341/136

* cited by examiner

Primary Examiner—Brian Young
Assistant Examiner—John B Nguyen
(74) Attorney, Agent, or Firm—Sterne, Kessler, Goldstein & Fox, P.L.L.C.

(57) ABSTRACT

A system (e.g., a digital-to-analog converter (DAC)) includes a digital section and an analog section. The digital section has a driver portion that generates drive signals based on received respective digital input signals. The drive signals are received at respective switches in the analog section. The driver portion includes logic gates that are used to generate the drive signals, such that a rise and fall time of complementary pairs of drive signals are substantially equal. The driver portion can optionally include an acceleration system to accelerate the rise and fall times of the drive signals. The switches generate respective analog signals from the drive signals.

25 Claims, 5 Drawing Sheets

Figure 1:
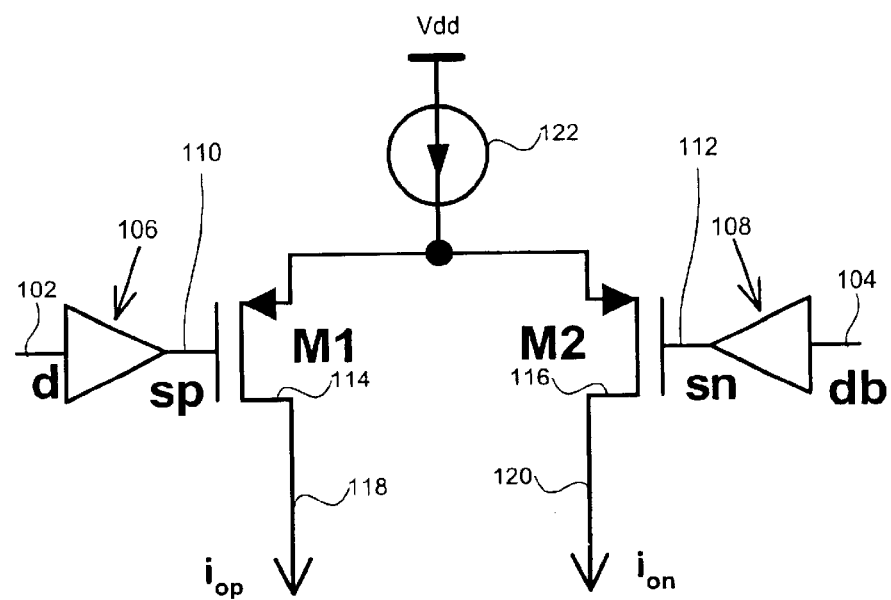

SYSTEM FOR MATCHING RISE AND FALL TIMES OF DRIVE SIGNALS IN A DIGITAL TO ANALOG CONVERTER

BACKGROUND OF THE INVENTION

1. Field of the Invention

The present invention is related to current-switched digital to analog converters.

2. Background Art

An analog section of digital-to-analog converters (DACs) usually receives complementary drive signals that are generated using a switch driver circuit. The switch driver circuit receives digital signals and generates the drive signals therefrom. The analog section uses the received drive signals to generate analog signals representative of the digital signals.

Ideally, the drive signals have rise and fall times that are substantially equal (e.g., a rise time of a first drive signal is substantially equal to a fall time of a second drive signal, and vice versa). This is because matching of the rise and fall times of the drive signals is critical to linearity performance of the DAC circuit, especially when a high speed sampling clock is required. Therefore, mismatches of the rise and fall times of the drive signals should be kept as small as possible. However, conflicts between elements in the switch driver circuit typically result in some mismatch between rise and fall times of the drive signals, which often results in a mismatch that is above threshold level.

Therefore, what is needed is a system and method that generate drive signals having rise and fall times that are substantially equal.

BRIEF SUMMARY OF THE INVENTION

Embodiments of the present invention provide a system including a digital section and an analog section. For example, the system can be a one or more bit current-switched digital-to-analog converter (DAC), or the like. The digital section includes first and second driving devices. The first driving device has a switch and a logic gate. The first driving device is configured to receive a first digital signal and generate a first drive signal therefrom. The second driving device has a switch and a logic gate. The second driving device is configured to receive a second digital signal and generate a second drive signal therefrom. The rise and fall times of the first and second drive signals are substantially equal. The analog signal section is configured to receive the first and second drive signals and generate first and second respective analog signals therefrom.

Other embodiments of the present invention provide a system including a digital section and an analog section. The digital section is configured to receive digital signals and includes a system for generating first and second drive signals having substantially equal rise and fall times therefrom. The analog section is configured to receive the first and second drive signals and generate first and second analog signals therefrom.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 is a schematic diagram of one element of current-switched digital-to-analog converter (DAC) arrays.

FIGS. 2, 3, 4, and 5 are schematic diagrams of various drivers in a digital section of FIG. 1 driving switches in an analog section of the system of FIG. 1.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a system (e.g., a current-switched digital-to-analog converter (DAC)) including a digital section and an analog section. The digital section has a driver portion that generates drive signals based on received respective digital input signals. The drive signals are received at respective switches in the analog section. The driver portion includes logic gates that are used to generate the drive signals, such that a rise and fall time of complementary pairs of drive signals are substantially equal. The driver portion can optionally include an acceleration system to accelerate the rise and fall times of the drive signals. The switches generate respective analog signals from the drive signals.

Current-Switched Digital to Analog Converter

FIG. 1 is a schematic diagram of a system 100 (e.g., one element of the current-switched digital-to-analog converter (DAC), or the like). Complementary digital signals d 102 and db 104 are received at drivers 106 and 108, respectively. Drivers 106 and 108 generate complementary drive signals sp 110 and sn 112, respectively, therefrom. Switches 114 and 116 (e.g., metal oxide semiconductor field effect transistors (MOSFETS) M1 and M2, or any other switching device) receive drive signals sp 110 and sn 112, respectively, at a control terminal (e.g., a gate), and generate analog signals iop 118 and ion 120, respectively, therefrom. In the example shown, switches 114 and 116 are PMOS devices. A current source 122 is coupled between the sources of M1 114 and M2 116 and a power supply Vdd.

It is to be appreciated an array of systems 100 can be used to form a multi-bit DAC, as would be apparent to one of ordinary skill in the art. Also, although switches are shown as MOSFETS, all other known devices that can function as switches can also be used, and are contemplated within the scope of the present invention.

Exemplary Driver for a Switch of a DAC

Figure 2:
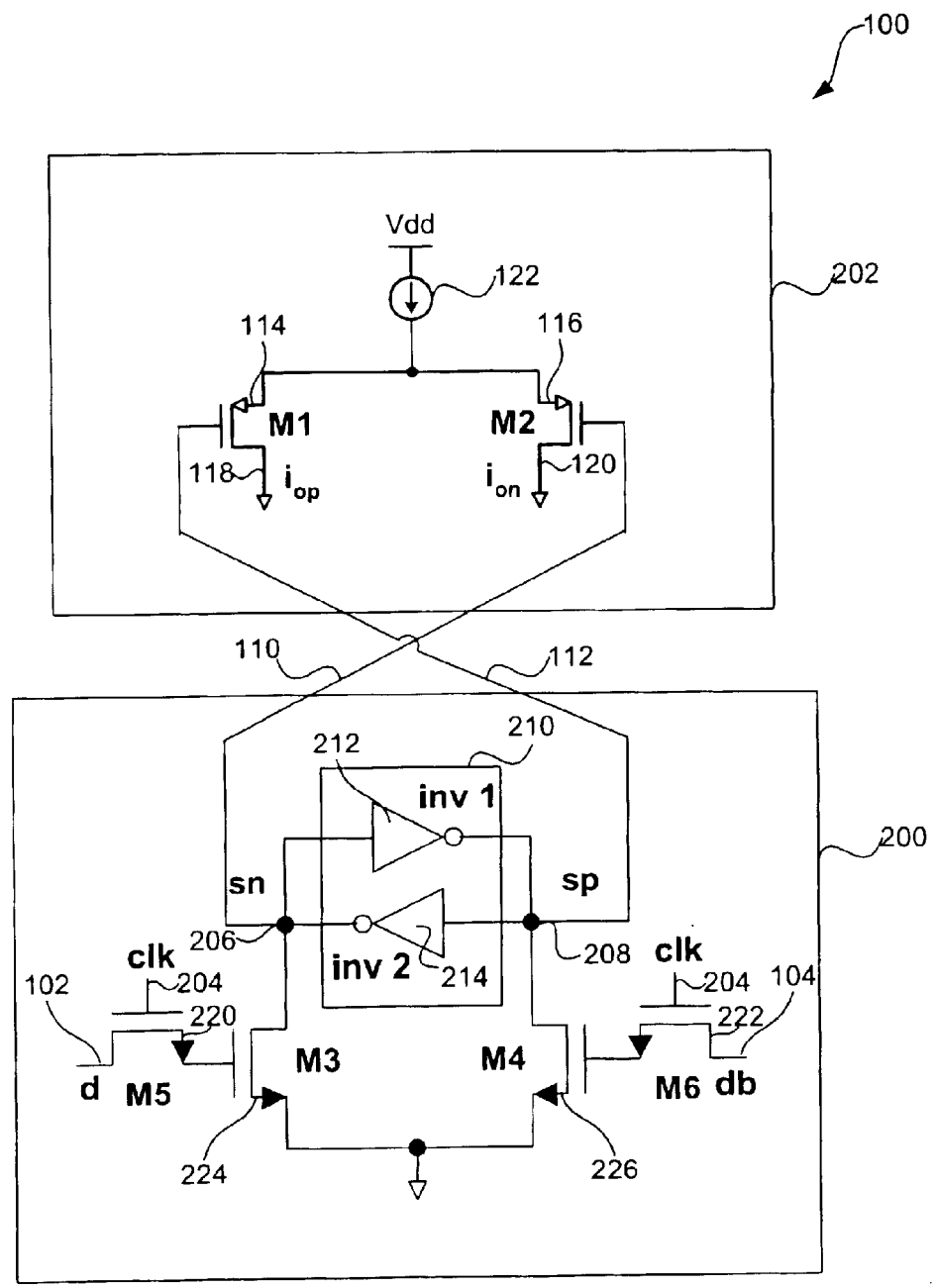

FIG. 2 is a schematic diagram of a digital section 200 (e.g., a driver portion) that replaces drivers 106 or 108, i.e., to produce signals sn 110 and sp 112. Along with driver portion 200, system 100 includes an analog section 202.

Driver portion 200 includes first and second switches M5 220 and M6 222 that receive digital signals d 102 and db 104, respectively, and are driven via clock signal 204 (CLK). For this description and the description of FIGS. 3, 4, and 5 below, it is assumed CLK is high so that switches M5 220 and M6 222 allow data flow. Driver 200 also includes switches M3 224 and M4 226 coupled between nodes 206 and 208, respectively, and ground (GND). A latch 210 is also coupled between nodes 206 and 208. Latch 210 includes inverters inv1 212 and inv2 214. Driving signals sn 110 and sp 112 are output nodes 206 and 208, respectively. There are at least two states of operation for system 100.

In a first state, initially sn 110 is high, sp 112 is low. Then d 102 becomes high and db 104 becomes low, turning M3 224 ON and turning M4 226 OFF. When M3 224 is ON (or active), M3 224 begins pulling sn 110 to ground, while inv1 212 starts pulling sp 112 high (e.g., to a power supply level). M3 224 must compete against inv2 214, which tries to keep sn 110 high. In order for M3 224 to pull sn 110 low, M3 224 must be stronger (e.g., larger, allow more current flow, etc.) than inv2 214. The competition between M3 224 and inv2 214 can affect fall time of sn 110 and rise time of sp 112.

In a second state, initially sn 110 is high, sp 112 is low. Then d 102 becomes low and db 104 becomes high, turning M3 224 OFF and turning M4 226 ON. When M4 226 is ON (or active), M4 226 begins pulling sp 112 to ground, while inv2 214 starts pulling sn 110 high (e.g., to a power supply level). M4 226 must compete against inv1 212, which tries to keep sp 112 high. In order for M4 226 to pull sp 112 low, M4 226 must be stronger (e.g., larger, allow more current flow, etc.) than inv1 212. The competition between M4 226 and inv1 212 can affect fall time of sp 112 and rise time of sn 110.

The configuration above usually results in rise and fall times of sn 110 and sp 112 to be mismatched. For example, a rise time of sn 110 can be substantially different from a fall time of sp 112, and vice versa.

Figure 3:
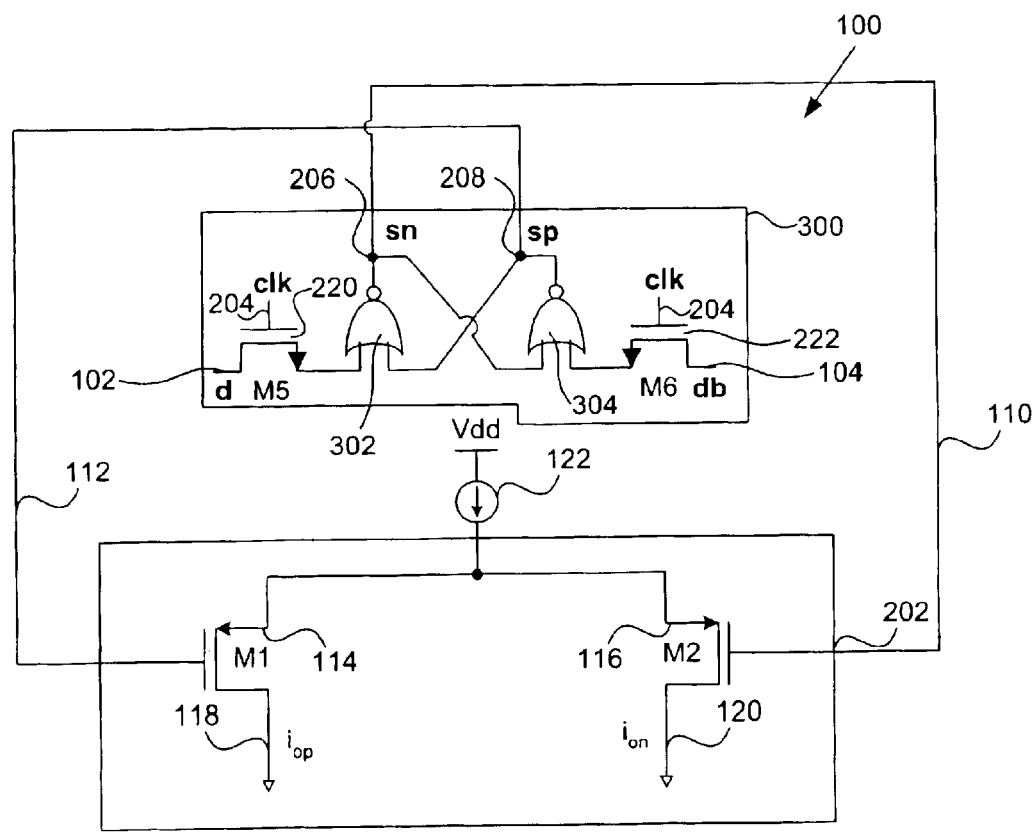
Figure 4:
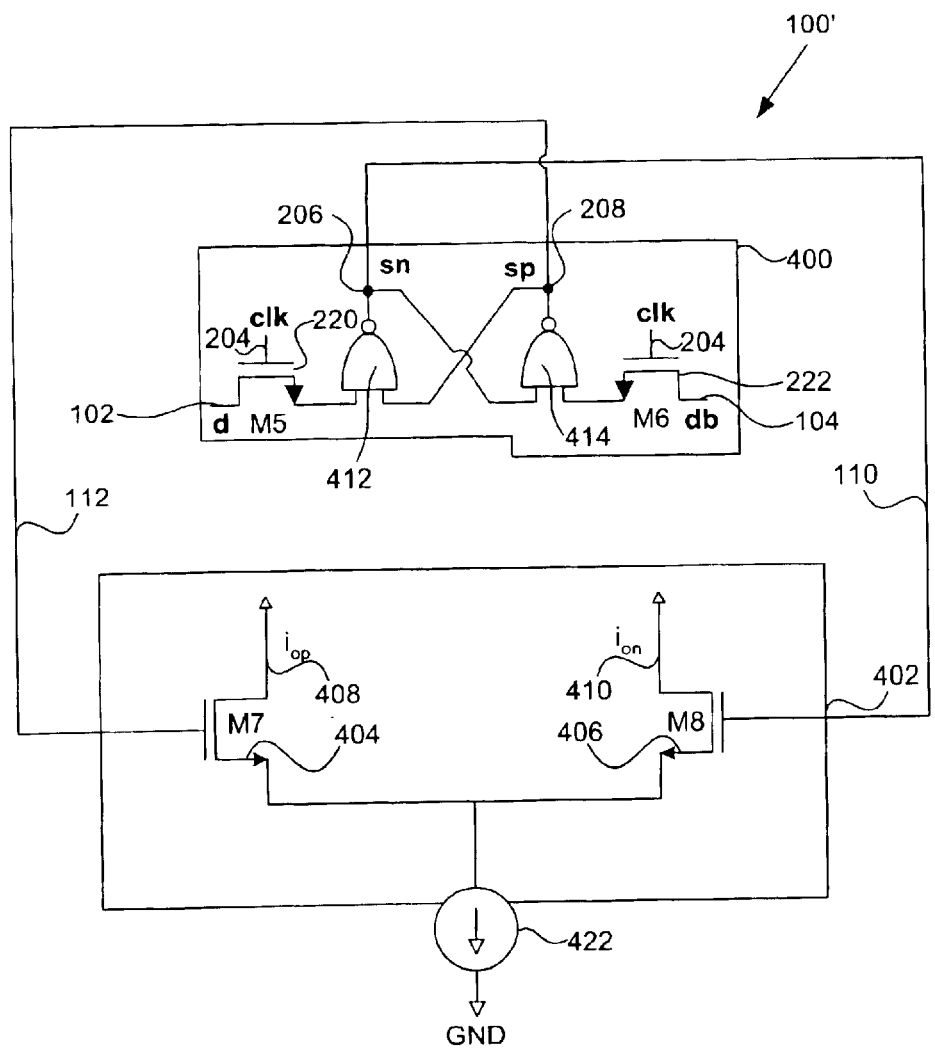
Figure 5:
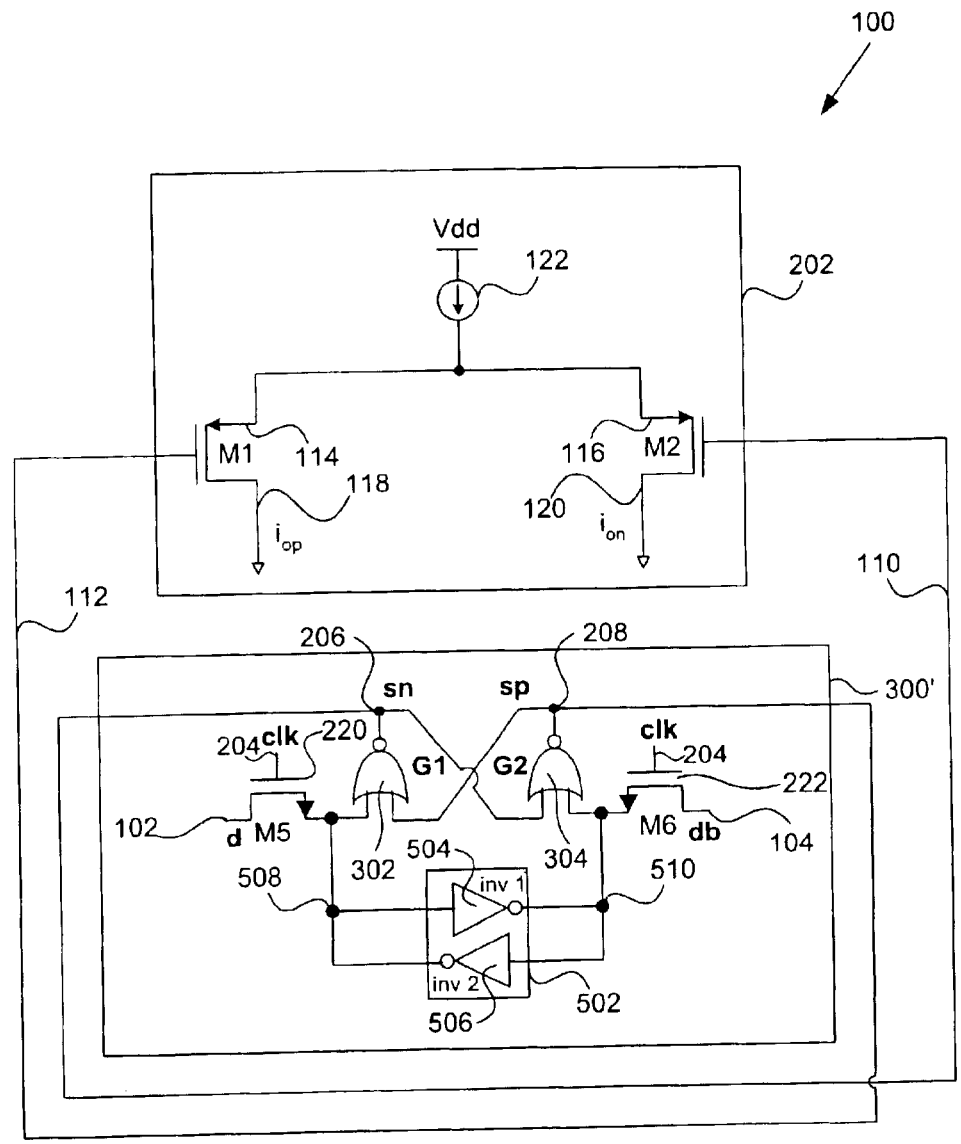

These mismatches can be substantially resolved using the driver configurations in FIGS. 3, 4, and 5.

Drivers for a Switch of a DAC Allowing for Substantially Matched Rise and Fall Times FIG. 3 shows a schematic diagram of a driver portion 300 in system 100 according to embodiments of the present invention. In driver portion 300, a first "driver" includes switch M5 220 and a logic gate 302 (e.g., a NOR gate) and a second "driver" includes switch M6 222 and a logic gate 304 (e.g., a NOR gate). The first and second "drivers" are used to generate signals sn 110 and sp 112, respectively. Logic gate 302 receives inputs from switch M5 220 and an output terminal of logic gate 304 (e.g., sp 112). Logic gate 304 receives inputs from switch M6 222 and an output terminal of logic gate 302 (e.g., sn 110).

In this embodiment, logic gates 302 and 304 directly control rise and fall times of sn 110 and sp 112, respectively, without the individual signals sn 110 and sp 112 having any effect on the other's signals rise and fall time. Also, no other circuit elements in driver 300 effect rise and fall times of sn 110 and sp 112. Thus, through the configuration shown, sn 110 rise time is allowed to be substantially equal to sp 112 rise time, and vice versa.

Using equal strength logic gates 302 and 304 allows flexibility in design because a designer can use logic gates 302 and 304 having any value required for specific applications. For example, devices 302 and 304 can be chosen to comply with specified rise and fall times for sn 110 and sp 112.

FIG. 4 is a schematic diagram of a system 100' according to embodiments of the present invention. System 100' includes a digital section 400 and an analog section 402. A main difference between analog section 202 and analog section 402 is that analog section 402 replaces PMOS devices M1 114 and M2 116 with NMOS devices M7 404 and M8 408 to generate iop 408 and ion 410, respectively. In order to adjust for this change, a current source 422 is coupled between sources of M7 404 and M8 408 and a ground node, and digital section 400 replaces NOR gates 302 and 304 in digital section 200 with NAND gates 412 and 414. However, the functionality of system 100' remains similar to that of system 100 described above.

FIG. 5 is a schematic diagram showing system 100 including digital section 300' having an acceleration system 502 (e.g., a latch) according to embodiments of the present invention. Acceleration system 502 is coupled to the first and second "drivers" between nodes 508 and 510. Acceleration system 502 includes a first inverter inv1 504 and a second inverter inv2 506. First inverter inv1 504 has its input coupled to node 508 and its output coupled to node 510. Oppositely, second inverter inv2 506 has an input coupled to node 510 and an output coupled to node 508.

In this configuration, latch 502 pulls and pushes current through nodes 508 and 510 along with switches M5 220 and M6 222. Using both latch 502 and switches M5 220 and M6 222 increases current flow through nodes 508 and 510. This increase in the rate of current flow through nodes 508 and 510 accelerates rise and fall times of sn 110 and sp 112.

In operation, when an application requires smaller rise and fall times than can be provided using only logic gates, acceleration system 502 can be used to meet those requirements.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system, comprising
    a digital section, including
        a first driving device having a switch and a logic gate, the first driving device configured to receive a first digital signal and generate a first drive signal therefrom,
        a second driving device having a switch and a logic gate, the second driving device configured to receive a second digital signal and generate a second drive signal therefrom, and
        an acceleration system coupled to the first and second driving devices and configured to accelerate the rise and fall times of the first and second drive signals, and
    an analog section configured to receive the first and second drive signals and generate first and second respective analog signals therefrom,
    wherein rise and fall times of the first and second drive signals are substantially equal.

2. The system of claim 1, wherein the logic gates in the first and second driving devices are NOR gates.

3. The system of claim 2, wherein a first input of each of the NOR gates is coupled to a respective one of the switches and a second input of each of the NOR gates is coupled to an output of an opposite one of the NOR gates.

4. The system of claim 2, wherein the analog device comprises:
   a first p-type transistor device receiving the first drive signal to generate the first analog signal therefrom; and
   a second p-type transistor receiving the second drive signal to generate the second analog signal therefrom.

5. The system of claim 1, wherein the logic gates in the first and second driving devices are NAND gates.

6. The system of claim 5, wherein a first input of each of the NAND gates is coupled to a respective one of the switches and a second input of each of the NAND gates is coupled to an output of another one of the NAND gates.

7. The system of claim 5, wherein the analog device comprises:
   a first n-type transistor device receiving the first drive signal to generate the first analog signal therefrom; and
   a second n-type transistor device receiving the second drive signal to generate the second analog signal therefrom.

8. The system of claim 1, wherein the acceleration system comprises:
   a first and second inverters coupled in parallel to each other.

9. The system of claim 8, wherein:
   the first inverter is coupled at its input to the first driving device and at its output to the second driving device; and
   the second inverter is coupled at its input to the second driving device and at its output to the first driving device.

10. The system of claim 1, wherein the acceleration system is a latch.

11. A system comprising:
   a digital section configured to receive digital signals including a means for generating first and second drive signals having substantially equal rise and fall times therefrom and means for accelerating the rise and fall times of the first and second drive signals; and
   an analog section configured to receive the first and second drive signals and generate first and second analog signals therefrom.

12. The system of claim 11, wherein the means for generating comprises first and second logic devices.

13. The system of claim 12, wherein the first and second logic devices are NOR gates.

14. The system of claim 12, wherein the first and second logic devices are NAND gates.

15. The system of claim 11, wherein the means for accelerating comprises first and second inverters.

16. The system of claim 11, wherein the means for accelerating comprises a latch.

17. A system, comprising
   a digital section, including
      a first driving device having a switch and a logic gate, the first driving device configured to receive a first digital signal and generate a first drive signal therefrom,
      a second driving device having a switch and a logic gate, the second driving device configured to receive a second digital signal and generate a second drive signal therefrom, wherein a first input of each of the logic gates is coupled to a respective one of the switches and a second input of each of the logic gates is coupled to an output of an opposite one of the logic gates, and
   an analog section configured to receive the first and second drive signals and generate first and second respective analog signals therefrom.

18. The system of claim 17, wherein the logic gates in the first and second driving devices are NOR gates.

19. The system of claim 18, wherein the analog device comprises:
   a first p-type transistor device receiving the first drive signal to generate the first analog signal therefrom; and
   a second p-type transistor receiving the second drive signal to generate the second analog signal therefrom.

20. The system of claim 17, wherein the logic gates in the first and second driving devices are NAND gates.

21. The system of claim 20, wherein the analog device comprises:
   a first n-type transistor device receiving the first drive signal to generate the first analog signal therefrom; and
   a second n-type transistor device receiving the second drive signal to generate the second analog signal therefrom.

22. The system of claim 17, wherein the digital section further comprises:
   an acceleration device coupled to the first and second driving devices and configured to accelerate the rise and fall times of the first and second drive signals.

23. The system of claim 22, wherein the acceleration system comprises:
   first and second inverters coupled in parallel to each other.

24. The system of claim 23, wherein:
   the first inverter is coupled at its input to the first driving device and at its output to the second driving device; and
   the second inverter is coupled at its input to the second driving device and at its output to the first driving device.

25. The system of claim 22, wherein the acceleration device is a latch.

* * * * *